United States Patent
Nagamoto et al.

[19]

[11] Patent Number: 6,156,423
[45] Date of Patent: Dec. 5, 2000

[54] BASE MATERIAL AND ADHESIVE TAPE USING THE SAME

[75] Inventors: Kouichi Nagamoto; Takeshi Kondoh, both of Urawa; Kazuhiro Takahashi, Kawaguchi; Katsuhisa Taguchi, Koshigaya; Kazuyoshi Ebe, Saitama, all of Japan

[73] Assignee: Lintec Corporation, Tokyo

[21] Appl. No.: 09/058,591

[22] Filed: Apr. 10, 1998

[30] Foreign Application Priority Data

Apr. 11, 1997 [JP] Japan ................................. 9-094177
Mar. 11, 1998 [JP] Japan ................................. 10-060211

[51] Int. Cl.⁷ ........................................................ B32B 7/12
[52] U.S. Cl. .................... 428/345; 428/354; 428/355 R; 428/423.3; 428/423.7; 428/424.2; 428/424.8
[58] Field of Search .................... 428/345, 354, 428/423.3, 423.7, 424.2, 424.8

[56] References Cited

U.S. PATENT DOCUMENTS

| 4,643,730 | 2/1987 | Chen et al. | 604/390 |
| 4,968,559 | 11/1990 | Kuroda et al. | 428/354 |

FOREIGN PATENT DOCUMENTS

| 0798355A2 | 10/1997 | European Pat. Off. |
| 62-153376 | 7/1987 | Japan. |
| 63-153814 | 6/1988 | Japan. |
| 09253964A | 9/1997 | Japan. |
| 221470A | 2/1990 | United Kingdom. |
| 2221469A | 2/1990 | United Kingdom. |

OTHER PUBLICATIONS

JP 60–107041 A (Oji Paper Co.) Dec. 6, 1985 (abstract), retrieved on Jun. 18, 1999, retrieved from EPO WPI Database.

Patent Abstracts of Japan; vol. 018, No. 568 (C–1266), Oct. 31, 1994 and JP 06206956 A (Nippon Kayaku Co Ltd), Jul. 26, 1994.

Patent Abstracts of Japan; vol. 096, No. 005, May 31, 1996 and JP 08 00209 A (Mitsubishi Paper Mills Ltd), Jan. 9, 1996.

*Primary Examiner*—Christopher Raimund
*Attorney, Agent, or Firm*—Ostrolenk, Faber, Gerb & Soffen, LLP

[57] ABSTRACT

A layer of base material has a film layer and a barrier layer on the film layer, and also adhesive tape has the base material and an adhesive layer on the barrier layer. Thus, they do not have any fish-eye or foreign substance on their surfaces, so that accuracy in thickness are improved and contamination of a material to be adhered with the adhesive layer is also improved.

13 Claims, 1 Drawing Sheet

BASE MATERIAL AND ADHESIVE TAPE USING THE SAME

BACKGROUND OF THE INVENTION

1. Field of the Invention

The present invention relates to a base material, especially to a base material for an adhesive tape to be used in the process of precision-machining of an optical structural element such as a lens, a semiconductor structural element such as a silicon wafer, or the like. The present invention also relates to an adhesive tape having such a base material.

2. Description of the Related Art

Heretofore, adhesive tapes have been used in the fields of optical industry, semiconductor industry, and so on, for manufacturing structural elements that require precision-machining.

Generally, the adhesive tape for surface protection of a semiconductor wafer can be prepared by the process including the steps of: melting a thermoplastic resin; forming a film-shaped base material as a base sheet by casting the melted thermoplastic resin by the use of a T-die, a blow-extrusion, a calender, or the like; and applying an adhesive agent on at least one surface of the base sheet. The adhesive tape thus obtained is typically used for holding a semiconductor wafer in place during the step of grinding a back side of the wafer and also the steps of dicing and isolating the wafer into pieces.

At first, we will explain the example of using the adhesive tape in the process of grinding a back side of a semiconductor wafer that has a front side on which a predetermined pattern is formed (i.e. the step of back-side grinding).

At the time of grinding the back side of the wafer, the back-side of the wafer is continuously rinsed by running pure water to remove scattered or fragmented remains (i.e., debris) and to reduce heat generated by the grinding. In this case, therefore, an adhesive tape is applied on the front side of the wafer to protect the pattern formed thereon from the grinding.

At the time of performing the steps of dicing and isolating the semiconductor wafer into pieces, an adhesive tape is applied on the back side of the wafer, and that the wafer on which the adhesive tape is being adhered is subjected into each of the steps of dicing, washing, drying, expanding, pick-upping, and mounting, successively.

These steps require that the adhesive tape should have the properties of, for example, having no part of the adhesive agent remaining on a wafer or a chip when the adhesive tape is removed after the step of back-side grinding or the steps of dicing and isolating. For solving this problem, several improvements have been disclosed in patent documents including Japanese Patent Application Laying-open No. 62-153376 (1987) and Japanese Patent Application Publication No. 5-77284 (1993).

The adhesive sheet disclosed in Japanese Patent Application Laying-open No. 62-153376 (1987) comprises an adhesive that contains urethane acrylate oligomer (m.w. 3,000~10,000) as a radiation-induced polymerized compound and a base sheet on which the adhesive is applied. Therefore, an adhesive strength of the adhesive sheet is sufficiently decreased by the effect of irradiating it with ultraviolet rays or the like in the step of picking up the semiconductor wafer after dicing. Thus, the adhesive agent does not remain on the back side of the wafer chip. On the other hand, the adhesive tape disclosed in Japanese Patent Application Publication No. 5-77284 (1993) comprises a water-swelling type adhesive agent as an adhesive layer applied on a surface of a base sheet. In this case, therefore, it becomes to possible to remove the adhesive agent attached on the wafer's surface by running water after the grinding step.

Each of the adhesive tapes described above uses a base material which is prepared as a film-shaped material by melting a thermoplastic resin such as vinyl chloride or polypropylene and casting the melted thermoplastic resin by the use of a T-die, a blow-extrusion, a calender, or the like.

In most cases, the base material to be used has a thickness of 50 $\mu$m or more in terms of wafer-protection and workability. During the process of forming the base material into a film, however, projections are sparsely formed on a surface of the base material as a result of mixing undesired foreign substances into the material or the existence of insoluble ingredients of its resin component or the like. Each of those projections are in the shape like a fish's eye with a height of about 10 to 50 $\mu$m (which is referred as "a fish-eye" in the following description). Therefore, the fish-eye acts as a center of spreading the breakage of a silicon wafer at the time of grinding the back side of the wafer. In this case, furthermore, another problem in that the fish-eye acts as a center of flying a chip off comes up at the time of dicing and isolating the chip.

The generation of fish-eyes may be under control if the base material is of less than 50 $\mu$m in thickness. However, such a thin film cannot attain the capability of wafer-protection and leads to poor workability.

For solving these disadvantages, Japanese Patent Application laying-open No. 9-253964 (1997) discloses a base material for an adhesive tape. The base material is formed by casting a liquid radiation-cured resin comprising a mixture of urethane acrylate oligomer and reactive diluted monomer followed by the step of curing the resin by irradiating with a radiation.

However, one of the drawbacks of forming an adhesive tape by directly applying an adhesive layer on a film layer of the base material is to pollute a adherend (e.g., a semiconductor wafer) with a residual adhesive (the so-called "particle") which remains on a surface of the adherend when the adhesive tape is removed from the adherend.

The present inventors and their coworkers have considered that the cause of the particle (i.e., the residual adhesive of the above adhesive agent on the adherend) is a bleeding of unacceptable ingredients from the film layer to the adhesive layer. The unacceptable ingredients have a low molecular weight and are comprised in the radiation-cured resin that forms the film layer of the base material. Eventually, they find that the solution to the above problem lies in using a base material in which a barrier layer is formed on the film layer. The barrier layer is responsible for preventing the bleeding from the film layer to the adhesive layer.

SUMMARY OF THE INVENTION

Accordingly, it is an object of the present invention to provide a base material for obtaining an adhesive tape having the excellent properties of improving the degree of contamination of a adherend with an adhesive as described above and providing the accuracy of thickness, in which fish-eyes and foreign substances are not included.

It is another object of the present invention to provide an adhesive tape that comprises the base material.

In a first aspect of the present invention, there is provided a base material comprising:

a film layer, which is formed by curing a mixture of urethane (meth) acrylate oligomer and reactive-diluted monomer by irradiating it with a radiation; and a barrier layer, which is formed on at least one surface of the film layer.

Here, the reactive-diluted monomer may be a monomer having a ring structure.

The monomer having the ring structure may be a monomer selected from a group consisting of:

cycloaliphatic compounds, aromatic compounds, and heterocyclic compounds.

The barrier layer may have a thickness of 0.1 µm to 40 µm.

In second aspect of the present invention, there is provided a adhesive tape comprising:

a base material having a film layer which is formed by curing a mixture of urethane (meth) acrylate oligomer and reactive-diluted monomer by irradiating it with a radiation, and a barrier layer which is formed on at least one surface of the film layer; and an adhesive layer which is formed on at least one surface of the barrier layer.

Here, the reactive-diluted monomer may be a monomer having a ring structure.

The monomer having a ring structure may be a monomer selected from a group consisting of:

cycloaliphatic compounds, aromatic compounds, and heterocyclic compounds.

The barrier layer may have a thickness of 0.1 µm to 40 µm.

By forming a barrier layer on a base material and making the barrier layer with a predetermined thickness, the present invention allows an adhesive tape having the excellent properties of improving the degree of contamination of a adherend with particles which are the residual adhesive on the adherend and providing accuracy of thickness, in which fish-eyes and foreign substances are not included.

This kind of the adhesive tape serves a useful function as a surface-protecting tape for various materials in the field of semiconductors, especially for example a semiconductor wafer in the step of grinding the back side of the wafer. Furthermore, a preferable base material having a breaking elongation of 10% or more can be obtained using a monomer having a ring structure as a reactive diluted monomer.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
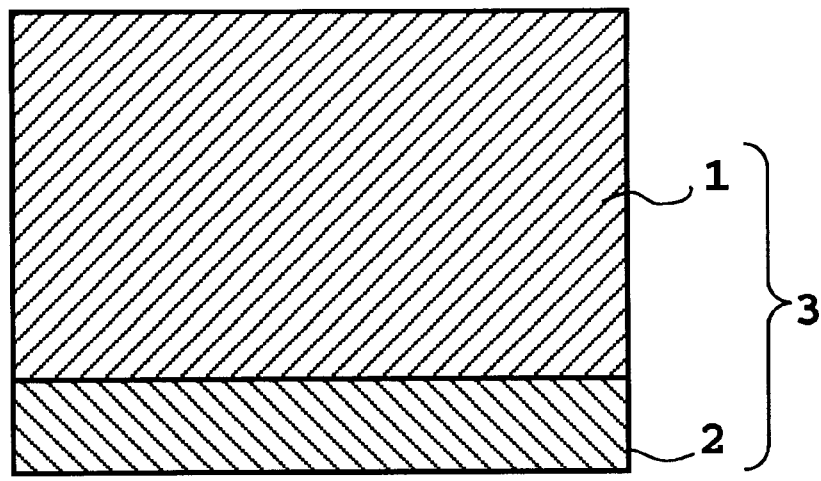
FIG. 1 is a schematic cross sectional view of a base material as one of embodiments of the present invention.

Referring now to FIG. 1, we will describe a base material as one of preferred embodiments of the present invention in detail. As shown in the figure, a layer of base material (hereinafter, referred as a base layer) 3 comprises a film layer 1 and a barrier layer 2 laminated on the film layer 1.

The film layer 1 is provided as a film made of a radiation-cured resin such as one disclosed in Japanese Patent Application laying-open No. 9-253964 (1997). A composition of the resin mainly consists of an urethane acrylate oligomer and a reactive-diluted monomer, so that it can be cured by means of radiation such as ultraviolet radiation or electron radiation to form a film.

The urethane (meth) acrylate oligomer to be used in the above composition may be a di-functional urethane (meth) acrylate with an ester-diol as its main skeleton, having a molecular weight preferably of 500 to 50,000, more preferably of 1,000 to 30,000. In this case, it may be of either polyester-polyol type or polyether-polyol type. Accordingly to the invention, the urethane (meth) acrylate oligomer may be used alone or in combination of one or more different types as a mixture thereof as necessary.

The reactive-diluted monomer to be used in the above composition may be preferably a mono-functional diluted monomer, or more preferably a monomer having a ring structure. It may be selected from the group of: cycloaliphatic compounds including isobornyl (meth) acrylate, dicyclopentenyl (meth) acrylate, dicyclopentanyl (meth) acrylate, dicyclopentenyl oxyethyl (meth) acrylate, cyclohexyl (meth) acrylate, and adamantane (meth) acrylate; aromatic compounds including benzyl acrylate; and heterocyclic compounds including tetrahydrofurfuryl (meth) acrylate, morpholine acrylate, N-vinyl pyrolidone, and N-vinyl caprolactam. Alternatively, a multi-functional (meth) acrylate may be used optionally.

For the above composition, the mixing ratio between the urethane (meth) acrylate oligomer and the reactive-diluted monomer is 95 to 5:5 to 95, preferably 50 to 70:50 to 30, based on a weight-percentage.

In addition to the above components, the film layer 1 may further comprise one or more desired additives, for example a photo-initiator such as a benzoin compound, an acetophenone compound, an acylphosphinoxide compound, a titanocene compound, a thioxanthone compound, and a peroxide compound; a photo-sensitizer such as amine or quinone; and a colorant such as dye or pigment.

One of preferable examples of the composition for forming the film layer 1 comprises: 100 parts by weight of a mixture of urethane (meth) acrylate oligomer and reactive-diluted monomer; and 0.1 to 10, or preferably 1 to 5 parts by weight of the photo-initiator. This kind of the film layer 1 can be prepared by forming a liquid resin of the above composition into a film by a conventional method. The conventional method comprises the steps of casting the resin by a fountain die or a comma coater and curing the casted resin by the application of a radiation such as UV or electron rays. A thickness of the resulting film layer 1 is preferably 50 to 1,995 µm, or more preferably 100 to 490 µm. It is preferable that an initial elastic coefficient of the film layer 1 is 100 to 100,000 kg/cm$^2$, or preferably 500 to 50,000 kg/cm$^2$, after the curing step.

The barrier layer 2 may be enough to prevent the bleeding of unacceptable residual ingredients of low molecular weights from the film layer 1. The unacceptable residual ingredients are generated in the film layer 1 after the film-formation. The barrier layer 2 may be comprised of, for example polyethylene terephtalate (hereinafter, abbreviated as PET), polyethylene naphthalate (hereinafter, abbreviated as PEN), low-density polyethylene (hereinafter, abbreviated as LDPE), thermoplastic polyurethane, thermoplastic acrylate resin, polypropylene, polyethylene/(meth) acrylate copolymer, or the like. Furthermore, the composition for forming the barrier layer 2 may include one or more additional components such as a colorant and a stabilizer which are popularly accepted by those skilled in the art.

The barrier layer 2 may be applied on the film layer 1 by welding or bonding a preformed film of the above composition to the film layer 1 by a conventional method such as a thermal welding. Alternatively, the barrier layer 2 may be formed on the film layer 1 using a commercially available film such as LDPE as it is. It is also possible to apply the barrier layer 2 on the film layer 1 by the process including the steps of preparing a solution of the above composition for producing a barrier layer and casting the solution on the film layer 1 by means of a die coater, a comma coater, a roll coater, a bar coater, or the like.

The resulting barrier layer 2 has a thickness preferably of 0.1 to 40 μm, or more preferably of 10 to 30 μm for the purpose of preventing both the generation of fish-eyes and the bleeding of unacceptable ingredients.

In FIG. 1, as described above, the barrier layer 2 is only formed on one side of the film layer 1. According to the present invention, however, both sides of the film layer 1 may have the barrier layers 2 as necessary and one of them may perform another function related to, for example, an improvement in workability for the step of grinding the back side of a silicon wafer (hereinafter, this step is simply referred as the step of back-side grinding).

The base layer 3 thus obtained has an initial elastic coefficient of 10 to 100,000 kg/cm$^2$, preferably 100 to 50,000 kg/cm$^2$; a breaking elongation of 10% or more, or preferably 100% or more; and a 10% stress of 10 to 500 kg/cm$^2$, or preferably 20 to 100 kg/cm$^2$, which are based on Japanese Industrial Standard (hereinafter, abbreviated as JIS) K7127. If a monomer having a ring structure is used as the reactive-diluted monomer, a base layer 3 having a breaking elongation of 10% or more can be easily obtained. If the breaking elongation is less than 10%, on the other hand, there is the fear of generating cracks in the cured layer when an adhesive tape (which is provided as a base material coated with an adhesive agent) is adhered on a adherend by means of a conventional taping machine.

An entire thickness of the base layer 3 is preferably 60 to 2,000 μm, more preferably 100 to 500 μm.

Consequently, an adhesive tape as one of preferred embodiments of the present invention can be prepared using the base layer 3 obtained by the above procedure.

Figure 2:
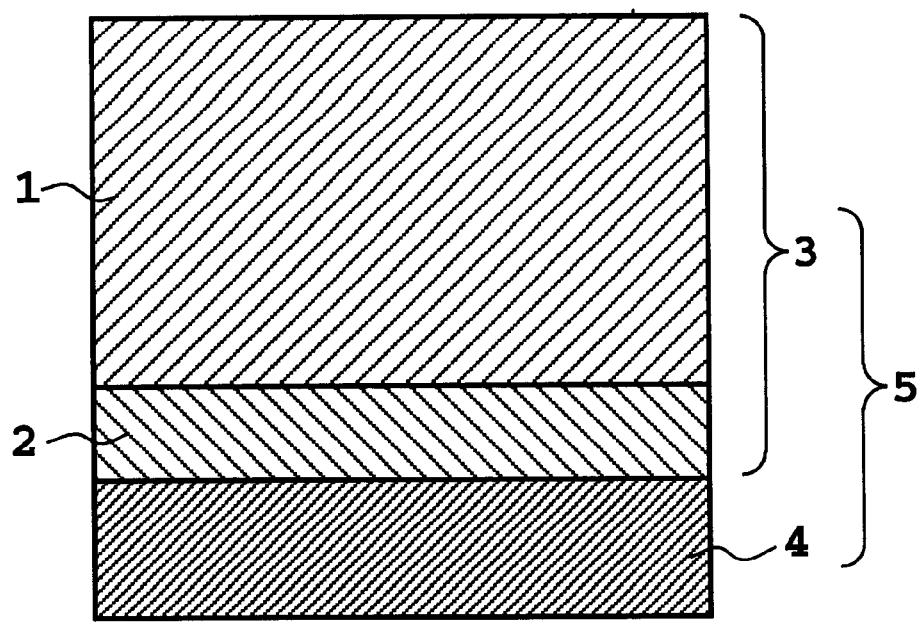
FIG. 2 is a schematic cross sectional view of an adhesive tape as one of embodiments of the present invention.

FIG. 2 is a cross sectional view of the adhesive tape. In the figure, reference numerals 1 to 3 denote the same constituents as that of shown in FIG. 1, 4 denotes an adhesive layer, and 5 denotes an adhesive tape.

The adhesive tape 5 is formed by further applying an adhesive layer 4 on a surface of the barrier layer 2 of the base layer 3. Constituents of the adhesive layer 4 may include those of the general adhesive tape such as a water-swelling type adhesive agent disclosed in Japanese Patent Application Publication No. 5-77284 (1993) and a radiation-hardening type adhesive agent disclosed in Japanese Patent Application Laying-open No. 62-153376 (1987).

The adhesive layer 4 is applied on the barrier layer 2 by means of the conventional method using a comma coating, a die coating, or the like. Preferably, the adhesive layer 4 has a thickness of 5 to 100 μm.

In FIG. 2, by the way, the barrier layer 2 is only formed on one side of the film layer 1 and then the adhesive layer 4 is formed on a surface of the barrier layer 2. According to the present invention, however, both sides of the film layer 1 may have the barrier layers 2 as necessary and one side or both sides of the barrier layers 2 may have the adhesive layer(s) 4.

Consequently, the adhesive tape 5 thus obtained has the advantages that:

the desired thickness of the adhesive tape 5 is attained with great accuracy of thickness;

the surface of the base layer 3 is free of fish-eyes and foreign substances; and the barrier layer 2 prevents the bleeding of unacceptable low-molecular-weight ingredients from the film layer 1 to the adhesive layer 4.

In the semiconductor-manufacturing process, for example, the adhesive tape 5 can be used as a favorable surface-protecting tape in terms of residual particles on a semiconductor wafer when the tape is peeled off after the steps of sticking the tape on a surface of the wafer and grinding the opposite surface thereof.

EXAMPLES

The present invention will be more clearly understood with reference to the following examples. In Table 1, urethane (meth) acrylate oligomers, reactive diluted monomers, and barrier layers used in the examples are listed.

EXAMPLE 1

A resin solution to be used for forming a film layer was prepared by mixing:

60 parts by weight of di-functional urethane acrylate with an average molecular weight of about 8000 (trade name: UX-3301, manufactured by Nippon Kayaku Co., Ltd.) as an urethane (meth) acrylate oligomer;

40 parts by weight of morpholine acrylate (trade name: ACMO, manufactured by Kojin Co., Ltd.) as a reactive-diluted monomer;

2 parts by weight of 1-hydroxy-cyclohexyl-phenyl-ketone (trade name: Irgacure 184, manufactured by Ciba Specialty Chemicals Co., Ltd.) as a photo-initiating agent; and 0.2 parts by weight of a phthalocyanine pigment.

Then, the resin solution was applied on a surface of a PET film of 38 μm in thickness (manufactured by Toray Co., Ltd.) as a casting-support film by means of a fountain die technique to make a film layer of 80 μm in thickness.

Immediately after the step of applying the resin solution, a LDPE GF-1 film of 30 μm in thickness (manufactured by Tamapoly Co., Ltd.) was laminated as a barrier layer on the other side of the film layer. Subsequently, the laminate was exposed to UV radiation with a light quantity of 250 mJ/cm$^2$ from a high-pressure mercury lamp (160 W/cm power) at a distance of 10 cm to cause cross-link and curing of the resin, resulting in a base material having a support film.

EXAMPLES 2 TO 4

In these examples, base materials with their respective support films were formed by the same procedure as that of Example 1 except that their mixing ratios of urethane (meth) acrylate oligomer and reactive-diluted monomer were different. That is, 30 parts by weight (Example 2), 50 parts by weight (Example 3), or 70 parts by weight (Example 4) of di-functional urethane acrylate with an average molecular weight of about 8000 (trade name: UX-3301, manufactured by Nippon Kayaku Co., Ltd.) as an urethane (meth) acrylate oligomer; and 70 parts by weight (Example 2), 50 parts by weight (Example 3), or 30 parts by weight (Example 4) of morpholine acrylate (trade name: ACMO, manufactured by Kojin Co., Ltd.) as a reactive-diluted monomer were formulated in the composition.

EXAMPLES 5 TO 7

In these examples, base materials with their respective support films were formed by the same procedure as that of Example 1 except that their reactive-diluted monomers were different. That is, the reactive-diluted monomer was cyclohexylacrylate (Example 5), isobornylacrylate (Example 6), or benzylacrylate (Example 7).

EXAMPLES 8 TO 11

In these examples, base materials with their respective support films were formed by the same procedure as that of Example 1 except that the barrier layer type and thickness varied. In addition, the thickness of the film layer was changed as the thickness of the corresponding barrier layer was changed.

In Example 8, the resin solution was applied on the PET film of a support film to make a film layer of 98 μm in thickness. Then, a PET film of 12 μm in thickness (manufactured by Toray Co., Ltd.) was used as a film for the barrier layer.

In Example 9, the resin solution was applied on the PET film of support film to make a film layer of 98 μm in thickness. Then, a PEN film of 12 μm in thickness (manufactured by Teijin Co., Ltd.) was used as a film for the barrier layer.

In Example 10, the resin solution was applied on the PET film of support film to make a film layer of 80 μm in thickness. Then, a thermoplastic urethane elastomer film of 30 μm in thickness (manufactured by Nisshinbouseki Co., Ltd.) was used as a film for the barrier layer.

In Example 11, the resin solution was applied on the PET film of a support film to make a film layer of 110 μm. Then a thermoplastic acryl resin (Trade name: Parachron W-197C, manufactured by Negami Kogyo Co., Ltd.) was used for the barrier layer. The thermoplastic acryl resin was applied on a surface of film layer side by means of a bar coater to make a film of 0.3 μm in thickness after drying.

COMPARATIVE EXAMPLE 1

A base material with a support film was formed by the same way as that of Example 1 except that the resin solution was applied to the support film to make a film layer of 110 μm in thickness and the barrier layer was not formed.

Adhesive tapes were manufactured using the base materials with the support film formed by Examples 1 to 11 and Comparative Example 1. For each of the base materials, an adhesive agent was applied on the barrier-layer-laminated side of the base film concurrently with peeling off the support film from the base material to make an adhesive coating of 20 μm in thickness. In this case, the adhesive agent was a water-swelling acrylic adhesive agent (disclosed in Japanese Patent Application Laying-open 5-77284 (1993)) comprising (i) a copolymer of ethyl acrylate, vinyl acetate, and methacrylic acid and (ii) polyethylene glycol lauryl ether and cross-linking with zinc acetate under the presence of potassium hydroxide.

The following evaluations were performed on the base materials and the adhesive tapes obtained by the above procedures. The evaluating items for each of the base materials were accuracy of thickness, initial elastic coefficient, breaking elongation, and 10% stress, while the evaluating items for each of the adhesive tapes were the number of fish-eyes, the property of back-side grinding when it is taped on the semiconductor wafer, and the number of particles remained on the wafer. We will explain these evaluating items and lists the obtained results in Table 2 below.

(1) Accuracy of thickness of the base material 100 points were arbitrary sampled from an area of 100 $m^2$ of the base material and then the thickness of each point was measured. The accuracy of thickness [R (μm)] was determined as the difference between the maximum and the minimum in the values of a series of measurements.

(2) Initial elastic coefficient of the base material

The measurement was performed at a testing speed of 200 mm per minute in conformity with JIS K7127.

(3) Breaking elongation of the base material

The measurement was performed at a testing speed of 200 mm per minute in conformity with JIS K7127.

(4) 10% stress of the base material

The measurement was performed at a testing speed of 200 mm per minute in conformity with JIS K7127.

(5) Number of fish-eyes in the adhesive tape

A visual examination was performed on an area of 10 $m^2$ on a surface of each adhesive tape as a sample. Each fish-eye with a height of 10 μm or more was counted to obtain the number of fish-eyes in the adhesive tape.

(6) Property of back-side grinding

Using the respective adhesive tapes, 50 silicon wafers (8 inches in diameter) were subjected to the step of back-side grinding in which the back side of each wafer was ground by a grinder DFG 840 (manufactured by Disco Co., Ltd.) and then subjected to a visual examination. We examined that water penetration into a space between the wafer and the adhesive tape, peeling of the adhesive tape, and a fracture of the wafer.

(7) Number of the particles

Each of the adhesive tapes was adhered on a silicon wafer (4 inches in diameter) and then subjected to the step of back-side grinding as the same way as that of the above item (6). The number of particles (i.e., 0.27 μm or more sized foreign substances) which remained on a surface of the wafer was measured after peeling off the tape after 1 hour (23° C., 65% RH) and also after 7 days (40° C., drying). The measurement device used in this evaluation was a laser type surface-analyzing device LS-5000 manufactured by Hitachi Electronic Engineering Co., Ltd.

TABLE 1

| | Urethane (meth) Acrylate | | Reactive-diluted Monomer | | A Thickness of Film | Barrier Layer | |
|---|---|---|---|---|---|---|---|
| | Type | Parts by Weight | Type | Parts by Weight | Layer (μm) | Type | Thickness (μm) |
| Example 1 | UX-3301 | 60 | Morpholine Acrylate | 40 | 80 | LDPE GF-1 | 30 |
| Example 2 | UX-3301 | 30 | Morpholine Acrylate | 70 | 80 | LDPE GF-1 | 30 |
| Example 3 | UX-3301 | 50 | Morpholine Acrylate | 50 | 80 | LDPE GF-1 | 30 |
| Example 4 | UX-3301 | 70 | Morpholine Acrylate | 30 | 80 | LDPE GF-1 | 30 |

TABLE 1-continued

|  | Urethane (meth) Acrylate | | Reactive-diluted Monomer | | A Thickness of Film | Barrier Layer | |
|---|---|---|---|---|---|---|---|
|  | Type | Parts by Weight | Type | Parts by Weight | Layer (μm) | Type | Thickness (μm) |
| Example 5 | UX-3301 | 60 | Cyclohexyl Acrylate | 40 | 80 | LDPE GF-1 | 30 |
| Example 6 | UX-3301 | 60 | Isobornyl Acrylate | 40 | 80 | LDPE GF-1 | 30 |
| Example 7 | UX-3301 | 60 | Benzyl Acrylate | 40 | 80 | LDPE GF-1 | 30 |
| Example 8 | UX-3301 | 60 | Morpholine Acrylate | 40 | 98 | PET Film | 12 |
| Example 9 | UX-3301 | 60 | Morpholine Acrylate | 40 | 98 | PEN Film | 12 |
| Example 10 | UX-3301 | 60 | Morpholine Acrylate | 40 | 80 | Thermoplastic Urethane Elastmer Film | 30 |
| Example 11 | UX-3301 | 60 | Morpholine Acrylate | 40 | 110 | Thermoplastic Acryl Resin | 0.3 |
| Comparative Example | UX-3301 | 60 | Morpholine Acrylate | 40 | 110 | — | — |

TABLE 2

|  | Base Material Accuracy of Thickness R: (μm) | Base Material Initial Elastic Coefficient (kg/cm$^2$) | Base Material Breaking Elongation (%) | Base Material 10% Stress (kg/cm$^2$) | The Number of Fish-eyes (No./10 m$^2$) | Abnormality Found in the Step of Back-Grinding | The number of Particles (No./4 inches) | |
|---|---|---|---|---|---|---|---|---|
|  |  |  |  |  |  |  | 1 hr. After Adhered (23° C., 65% RH) | 7 days After Adhered (40° C., Drying) |
| Example 1 | 6 | 1000 | 350 | 50 | 0 | No | ≦50 | ≦50 |
| Example 2 | 6 | 1500 | 350 | 100 | 0 | No | ≦50 | ≦50 |
| Example 3 | 6 | 1200 | 300 | 70 | 0 | No | ≦50 | ≦50 |
| Example 4 | 6 | 800 | 300 | 30 | 0 | No | ≦50 | ≦50 |
| Example 5 | 6 | 800 | 350 | 30 | 0 | No | ≦50 | ≦50 |
| Example 6 | 6 | 1200 | 350 | 40 | 0 | No | ≦50 | ≦50 |
| Example 7 | 6 | 800 | 350 | 30 | 0 | No | ≦50 | ≦50 |
| Example 8 | 6 | 3000 | 150 | 200 | 0 | No | ≦50 | ≦50 |
| Example 9 | 6 | 3000 | 150 | 200 | 0 | No | ≦50 | ≦50 |
| Example 10 | 6 | 1000 | 350 | 40 | 0 | No | ≦50 | ≦50 |
| Example 11 | 6 | 1000 | 350 | 40 | 0 | No | ≦50 | ≦50 |
| Comparative Example | 6 | 1000 | 350 | 40 | 0 | No | ≦50 | 200–500 |

Regarding the base materials obtained by casting the radiation-cured resin as the film layer, as is evident from the results listed in Table 2, each of them showed an excellent accuracy of thickness and a breaking elongation of 10% or more, which were extremely encouraging results. We also found that initial elongation coefficient and 10% stress were in their preferable ranges for our purpose. Furthermore, we could not observe any fish-eye and any foreign substances in each of the base materials. In the step of back-side grinding, furthermore, we could not find any abnormality in the silicon wafers being tested.

Regarding the adhesive tapes of the present invention in which each of them uses the base material with the barrier layer (Examples 1 to 11), we obtained excellent results in a series of measurements on the number of particles.

Regarding the adhesive tapes of Comparative Example 1, which did not have any barrier layer, the number of particles was increased when the back-side ground wafer was left for 7 days at a temperature of 40° C. under the drying conditions.

Therefore, it is apparent from the results that the silicon wafer becomes polluted with foreign substances or the like if the adhesive agent is directly applied on the film layer of the radiation-cured resin. In this case, it is assumed that unacceptable low-molecular-weight ingredients of some kind are dispersed into the adhesive layer and they pollute the wafer's surface. According to the present invention, however, the dispersion of the unacceptable ingredients can be prevented by providing the adhesive tape with the barrier layer as disclosed in Examples 1 to 11. Therefore, the undesired ingredients of the adhesive tape cannot pollute the wafer.

As a consequence, the adhesive tape of the present invention, which is of a laminate type, is far superior to the conventional one as a surface-protective tape for a silicon wafer when the silicon wafer is subjected to the process of manufacturing a semiconductor, especially in the step of back-side grinding.

The present invention has been described in detail with respect from the foregoing to those skilled in the art that changes and modifications may be made without departing from the invention in its broader aspect, and it is the invention, therefore, in the apparent claims to cover all such changes and modifications as fall within the true sprit of the invention.

What is claimed is:

1. An adhesive tape comprising:
 a base material having a film layer which is a radiation cured mixture of urethane (meth) acrylate oligomer and reactive-diluted monomer, and a barrier layer on at least one surface of said film layer; and an adhesive layer on at least one surface of said barrier layer.

2. The adhesive tape as claimed in claim 1, wherein said reactive-diluted monomer is a monomer having a ring structure.

3. The adhesive tape as claimed in claim 2, wherein said monomer having a ring structure is a monomer selected from the group consisting of: cycloaliphatic compounds, aromatic compounds, and heterocyclic compounds.

4. The adhesive tape as claimed in claim 1, wherein said barrier layer has a thickness of 0.1 $\mu$m to 40 $\mu$m.

5. The adhesive tape as claimed in claim 2, wherein said barrier layer has a thickness of 0.1 $\mu$m to 40 $\mu$m.

6. The adhesive tape as claimed in claim 5, wherein said oligomer has a molecular weight of 500 to 50,000 and constitutes 5 to 95 weight percent of the mixture and wherein the film layer has a thickness of 50 to 1995 $\mu$m and an elastic coefficient of 100 to 100,000 kg/cm$^2$.

7. The adhesive tape as claimed in claim 6, wherein said barrier layer has a thickness of 10–30 $\mu$m, said oligomer has a molecular weight of 1,000 to 30,000 and constitutes 50 to 70 weight percent of said mixture, and wherein said film has a thickness of 100–490 $\mu$m and a elastic coefficient of 500 to 50,000 kg/cm$^2$.

8. The adhesive tape as claimed in claim 1, wherein said oligomer has a molecular weight of 500 to 50,000 and constitutes 5 to 95 weight percent of the mixture and wherein the film layer has a thickness has a thickness of 50 to 1995 $\mu$m and an elastic coefficient of 100 to 100,000 kg/cm$^2$.

9. The adhesive tape as claimed in claim 8, wherein said barrier layer has a thickness of 10–30 $\mu$m, said oligomer has a molecular weight of 1,000 to 30,000 and constitutes 50 to 70 weight percent of said mixture, and wherein said film has a thickness of 100–490 $\mu$m and a elastic coefficient of 500 to 50,000 kg/cm$^2$.

10. An adhesive tape comprising:

a base material having a thickness of 60 to 2000 $\mu$m which is a film layer of radiation cured mixture of urethane (meth) acrylate oligomer and reactive-diluted monomer, and a 0.1 to 40 $\mu$m thick barrier layer confined by the perimeter of the film layer and having first and second opposed surfaces, the first surface of the barrier layer being on a surface of the film layer; and a 5 to 100 $\mu$m thick adhesive layer on the second surface of the barrier layer.

11. The adhesive tape as claimed in claim 10, in which the thickness of base material is 100 to 500 $\mu$m.

12. The adhesive tape as claimed in claim 11, wherein said oligomer has a molecular weight of 500 to 50,000 and constitutes 5 to 95 weight percent of the mixture and wherein the film layer has an elastic coefficient of 100 to 100,000 kg/cm$^2$.

13. The adhesive tape as claimed in claim 12, wherein said barrier layer has a thickness of 10–30 $\mu$m, said oligomer has a molecular weight of 1,000 to 30,000 and constitutes 50 to 70 weight percent of said mixture, and wherein said film has an elastic coefficient of 500 to 50,000 kg/cm$^2$.

* * * * *